United States Patent [19]

Dishart et al.

[11] Patent Number: 4,867,800
[45] Date of Patent: Sep. 19, 1989

[54] CLEANING COMPOSITION OF TERPENE COMPOUND AND DIBASIC ESTER

[75] Inventors: Kenneth T. Dishart; Mark C. Wolff, both of Wilmington, Del.

[73] Assignee: E. I. Du Pont de Nemours and Company, Wilmington, Del.

[21] Appl. No.: 222,496

[22] Filed: Jul. 21, 1988

[51] Int. Cl.⁴ .......................... B08B 7/00; C11D 7/50
[52] U.S. Cl. ........................................ 134/40; 134/42; 252/162; 252/170; 252/DIG. 14
[58] Field of Search ............... 252/162, DIG. 14, 170; 134/42, 40

[56] References Cited

U.S. PATENT DOCUMENTS

| | | | |
|---|---|---|---|
| 4,617,251 | 10/1986 | Sizensky | 430/256 |
| 4,640,719 | 2/1987 | Hayes et al. | 134/40 |
| 4,673,524 | 6/1987 | Dean | 252/118 |
| 4,780,235 | 10/1988 | Jackson | 252/170 |

OTHER PUBLICATIONS

Du Pont Dibasic Esters (DBEs) Solvents and Intermediates for Industry (Product Bulletin).

*Primary Examiner*—Prince E. Willis
*Assistant Examiner*—Susan Franklin

[57] ABSTRACT

A cleaning composition is disclosed which is suitable for cleaning flux residue from a printed circuit board and comprises a terpene compound and dibasic ester solvent.

14 Claims, No Drawings

CLEANING COMPOSITION OF TERPENE COMPOUND AND DIBASIC ESTER

BACKGROUND OF THE INVENTION

The present invention relates to a cleaning composition and a method for removal of solder flux from a surface of a substrate and particularly a surface of a printed circuit board.

Prior to a soldering operation for attachment of components to printed circuit boards it is conventional and essential to apply a soldering flux to insure an adherent bond of solder. The printed circuit board may be protected with a solder mask which covers all areas of the substrate except where solder is to contact and adhere to a conductive surface portion. Application of flux and solder can be done by hand, wave or reflow methods. In wave soldering the substrate is mechanically conveyed over and contacted with the flux and then with a molten solder wave. The solder adheres to all conductive surfaces on the substrate except where solder mask is present. In reflow soldering a solder paste, containing both flux and solder metal in powder form, is applied only to the points where solder bonds are to be made, components are set in place and the entire printed circuit board assembly is heated to melt the solder. Flux which remains on the assembly after soldering can cause premature failure of the electrical circuitry through corrosion, absorption of water and other effects and must be removed.

In Hayes et al. U.S. Pat. No. 4,640,719 use of terpene compounds is disclosed in cleaning printed wiring boards. This patent discloses cleaning of residual flux and particularly rosin solder flux and adhesive tape residues employing terpene compounds such as pinene including its alpha and beta isomer, gamma terpinene, delta-3-carene, limonene and dipentene with limonene and dipentene preferred. Dipentene is the racemic mixture of the limonene optically active isomers. This patent further discloses that these terpene compounds are almost completely insoluble in water and cannot be directly flushed away by water. Therefore in a preferred embodiment terpene compounds are combined with one or more emulsifying surfactants capable of emulsifying terpenes with water to facilitate their removal.

SUMMARY OF THE INVENTION

The present invention is directed to a cleaning composition comprising (a) a terpene compound and (b) a dibasic ester and the use of such composition in reducing residues on a surface of a substrate such as a printed circuit board.

DETAILED DESCRIPTION OF THE INVENTION

The cleaning composition of the present invention can be employed upon any substrate surface particularly one to which residual excess flux is present such as after a solder operation. A preferred substrate surface is a printed circuit board surface which may or may not be protected by a solder mask permanent coating in areas where solder is not to adhere. In the present disclosure printed circuit board is employed in a generic sense and is inclusive of printed wiring boards.

In the present invention one or more terpene compounds are used as one component of a cleaning composition. This component is employed in combination with a dibasic ester solvent and this combination is considered to be a replacement over the use of chlorofluorocarbon (CFC) solvents which are presently employed as cleaning agents with particular suitability in cleaning printed circuit boards. An azeotrope of trichlorotrifluoroethane and methanol such as sold under the trademark Freon ® TMS by E. I. du Pont de Nemours and Company is superior to known methods of cleaning solder flux from a surface of a printed wiring board. However the use of fully halogenated chlorofluorocarbon materials are considered to present a threat to the environment because of their involvement in stratospheric ozone depletion. Therefore any improvement in alternate cleaning compositions which do not contain a fully halogenated CFC is considered significant. In accordance with the present invention residual ionic contaminants are reduced to low levels (even though such levels may be somewhat higher than cleaning with a fully halogenated CFC methanol azeotrope). However the results herein are considered to be a significant improvement compared to use of other cleaning agents including use of a terpene compound in combination with an emulsifying agent.

In accordance with the present invention a dibasic ester or combination of dibasic ester solvents is employed with the terpene compound. A terpene emulsifying agent is not necessary although an emulsifying agent can be employed in the present disclosure. Dibasic ester is employed in its normal definition and include typical dialkyl esters of dicarboxylic acids (dibasic acids) capable of undergoing reactions of the ester group, such as hydrolysis and saponification. Conventionally at low and high pH they can be hydrolyzed to their corresponding alcohols and dibasic acids or acid salts. Preferred dibasic ester solvents are: dimethyl adipate, dimethyl gluterate and dimethyl succinate and mixtures thereof. Other esters with longer chain alkyl groups derived from alcohols, such as ethyl, propyl, isopropyl, butyl and amyl and mixtures thereof including methyl can be employed. Also the acid portion of these esters can be derived from other lower and higher molecular weight dibasic acids, such as oxalic, malonic, pimelic, suberic, and azelaic acids and mixtures thereof including the preferred dibasic acids. These and other esters can be employed provided they are mutually soluble with the terpene compound, are not classified as flammable liquids (Flash Point at or above 100° F. by Tag Closed Cup method) and have at least 2.0 wt. % solubility in water at 25° C. The concentration or ratio of terpene to dibasic ester is not considered critical and the percentage of these two components can vary with wide ranges such as from 50 to 95% terpene and conversely 5 to 50% dibasic acid on the basis of the weight percent of these two components only.

Additionally if a combination of esters is employed the respective amounts are not considered critical and commercially available mixtures may be directly utilized.

An important criteria in the present invention is a reduction of ionic contamination due to cleaning with a combination of a terpene compound and a dibasic ester. A preferred substrate for cleaning is a printed circuit board and more particularly a printed circuit board contaminated with rosin flux after a soldering operation. A need for cleanliness on surfaces of the board becomes essential due to defects which can result either at the time of manufacture or subsequently in use of such printed circuit boards. For example corrosion of the circuit board can occur due to contamination from a rosin flux.

In the cleaning operation the method of contact of the terpene/dibasic ester combination is not critical. A preferred method of application of the cleaning composition is by spraying but other conventional contact operations can be employed including a dipping process. Elevated temperature of the cleaning composition is desirable such as a temperature up to 90° C. but room temperature material may be directly applied.

After application of the liquid preferably the substrate is rinsed with water such as deionized water.

EXAMPLE

To illustrate the present invention the following example is provided.

Three terpene hydrocarbon solvent compositions were compared for cleaning efficiency in removal of ionic contamination residues from printed wiring boards (PWBs) using a two-step cleaning process of solvent contact followed by water rinsing.

Solvent 1 was a composition containing terpene hydrocarbons, principally dipentene, with an emulsifying surfactant and was the product tradenamed "Bioact" EC-7 sold by the Petroferm Company.

Solvent 2 was a mixture of 80% by weight Solvent 1 (Bioact EC-7) and 20% by weight dibasic esters (DBE).

Solvent 3 was a mixture of 80% by weight terpene hydrocarbons, principally dipentene, and 20% by weight dibasic esters (DBE) and containing no added surfactants. The dibasic esters of Solvent 2 and Solvent 3 were a mixture by weight of 17% dimethyl adipate, 66% dimethyl glutarate and 17% dimethyl succinate and sold by the Du Pont Company. The terpene hydrocarbon portion of Solvent 3 was a product of Hercules tradenamed Dipentene No. 122.

All PWBs were soldered on an Electrovert Econopak II wave soldering machine with a 6 feet per minute belt speed and a 500° C. preheater setting to give an approximate 85° C. PWB top temperature prior to soldering with a 63/37 by weight eutectic tin/lead solder wave maintained at 250° C. The solder flux applied in a separate wave prior to the preheat and soldering operation was a commonly used rosin, mildly activated flux (Alpha 611F).

Sets of five printed wiring boards, soldered as described above, were cleaned with each solvent. The boards were sprayed individually with the solvent for 4 minutes using a cycle of 2 minutes at 30 psi, followed by 2 minutes at 100 psi. Excess liquid solvent was removed by blowing with compressed air and then the boards were rinsed with water in a 3 stage commercial water cleaner. The belt speed was 2 feet per minute with water temperature maintained at 65° C.

Residual ionic contamination was measured according to military specification method MIL-P-28809 in an "Omega Meter" 600. 2500 ml of 75 weight % isopropyl alcohol and 25 weight % water was used in a 15 minute test. Individual readings were made for each cleaned PWB. The average result for each solvent and the computed standard deviations and variance are shown below.

|  | Average Residual Ionic Contamination, Micrograms NaCl Equivalents/Sq. Inch | Standard Deviation | Variance |
| --- | --- | --- | --- |
| 1. Solvent 1 | 13.6 | 0.63 | 0.40 |
| 2. Solvent 2 | 7.7 | 0.31 | 0.10 |
| 3. Solvent 3 | 7.5 | 0.55 | 0.31 |

These results demonstrate significantly improved cleaning efficiency of solvent 2 and 3 which contained terpene hydrocarbons (with and without an added emulsifying surfactant) in combination with dibasic esters in comparison with solvent 1 which contained terpene hydrocarbons (and an emulsifying surfactant).

What is claimed is:

1. A cleaning composition for removing solder flux residues from the surface of a substrate comprising (a) a terpene compound and (b) a dibasic ester solvent having a flash point at or above 100° F. by Tag close Cup method and at least 2.0 weight percent solubility in water at 25° C.

2. The cleaning composition of claim 1 wherein the terpene compound is dipentene or the d-form of limonene or l-form of limonene.

3. The cleaning composition of claim 2 wherein the terpene compound is dipentene.

4. The cleaning composition of claim 1 wherein the dibasic ester solvent is a dimethyl ester.

5. The cleaning composition of claim 1 wherein the dimethyl ester solvent is dimethyl adipate, dimethyl glutarate, dimethyl succinate or combination thereof.

6. The cleaning composition of claim 1 wherein a combination of dimethyl ester solvents is employed.

7. A process for removing solder flux residues from a surface of a substrate comprising contacting the surface with a cleaning composition containing (a) a terpene compound and (b) a dibasic ester solvent having a flash point at or above 100° F. by Tag close Cup method and at least 2.0 weight percent solubility in water at 25° C.

8. The process of claim 7 wherein the substrate comprises a printed circuit board.

9. The process of claim 8 wherein the printed circuit board contains solder flux residue.

10. The process of claim 7 wherein the terpene compound is dipentene or the d-form of limonene or l-form of limonene.

11. The process of claim 10 wherein the terpene compound is dipentene.

12. The process of claim 7 wherein the dibasic ester solvent is a dimethyl ester.

13. The process of claim 7 wherein the dimethyl ester solvent is dimethyl adipate, dimethyl glutarate dimethyl succinate or combination thereof.

14. The process of claim 7 wherein a combination of dimethyl ester solvents is employed.

* * * * *

REEXAMINATION CERTIFICATE (2476th)
United States Patent [19]
Dishart et al.

[11] B1 4,867,800
[45] Certificate Issued Feb. 14, 1995

[54] CLEANING COMPOSITION OF TERPENE COMPOUND AND DIBASIC ESTER

[75] Inventors: Kenneth T. Dishart; Mark C. Wolff, both of Wilmington, Del.

[73] Assignee: E. I. Du Pont de Nemours & Comp., Wilmington, Del.

Reexamination Request:
No. 90/003,178, Aug. 30, 1993

Reexamination Certificate for:
Patent No.: 4,867,800
Issued: Sep. 19, 1989
Appl. No.: 222,496
Filed: Jul. 21, 1988

[51] Int. Cl.$^6$ ............................ B08B 7/00; C11D 7/50
[52] U.S. Cl. ........................................ 134/40; 134/42; 252/162; 252/170; 252/DIG. 14
[58] Field of Search ............... 134/2, 40, 42; 252/162, 252/170, DIG. 14

[56] References Cited
U.S. PATENT DOCUMENTS

| | | | |
|---|---|---|---|
| 4,617,251 | 10/1986 | Srzensky | 430/256 |
| 4,640,719 | 2/1987 | Hayes et al. | 134/40 |
| 4,673,524 | 6/1987 | Dean | 252/118 |
| 4,780,235 | 10/1988 | Jackson | 252/170 |
| 4,934,391 | 6/1990 | Futch et al. | 134/40 |
| 5,011,620 | 8/1991 | Dishart et al. | 252/118 |
| 5,062,988 | 11/1991 | Dishart et al. | 252/170 |
| 5,084,200 | 1/1992 | Dishart et al. | 252/173 |
| 5,096,501 | 3/1992 | Dishart et al. | 134/10 |

OTHER PUBLICATIONS

Du Pont Dibasic Esters (DBEs) Solvents and Intermediates for Industry (Product Bulletin).

*Primary Examiner*—Paul Lieberman

[57] ABSTRACT

A cleaning composition is disclosed which is suitable for cleaning flux residue from a printed circuit board and comprises a terpene compound and dibasic ester solvent.

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-14 are cancelled.

* * * * *